(12) United States Patent
Jindal et al.

(10) Patent No.: US 11,668,003 B2
(45) Date of Patent: Jun. 6, 2023

(54) DEPOSITION SYSTEM WITH A MULTI-CATHODE

(71) Applicant: Applied Materials, Inc., Santa Clara, CA (US)

(72) Inventors: Vibhu Jindal, San Jose, CA (US); Sanjay Bhat, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/552,505

(22) Filed: Dec. 16, 2021

(65) Prior Publication Data

US 2022/0106679 A1   Apr. 7, 2022

Related U.S. Application Data

(63) Continuation of application No. 16/444,560, filed on Jun. 18, 2019, now Pat. No. 11,230,761.

(60) Provisional application No. 62/686,977, filed on Jun. 19, 2018.

(51) Int. Cl.
| | |
|---|---|
| *H01J 37/34* | (2006.01) |
| *C23C 14/35* | (2006.01) |
| *C23C 14/04* | (2006.01) |
| *C23C 14/34* | (2006.01) |
| *C23C 14/18* | (2006.01) |

(52) U.S. Cl.
CPC .......... *C23C 14/351* (2013.01); *C23C 14/042* (2013.01); *C23C 14/185* (2013.01); *C23C 14/3407* (2013.01); *H01J 37/3408* (2013.01); *H01J 37/3429* (2013.01)

(58) Field of Classification Search
None
See application file for complete search history.

(56) References Cited

U.S. PATENT DOCUMENTS

| | | | |
|---|---|---|---|
| 5,252,194 A | 10/1993 | Demaray et al. | |
| 6,051,113 A * | 4/2000 | Moslehi ................ | C23C 14/568 |
| | | | 204/192.15 |
| 6,221,217 B1 | 4/2001 | Moslehi et al. | |
| 2003/0217913 A1 | 11/2003 | Hong et al. | |
| 2004/0140205 A1 | 7/2004 | Fu et al. | |
| 2008/0099329 A1 | 5/2008 | Pavloff et al. | |
| 2010/0243440 A1 | 9/2010 | Miller et al. | |
| 2011/0220494 A1* | 9/2011 | Ding .................. | H01J 37/3408 |
| | | | 204/298.16 |
| 2012/0027954 A1 | 2/2012 | Liu et al. | |

(Continued)

FOREIGN PATENT DOCUMENTS

| | | |
|---|---|---|
| JP | H05025626 A | 2/1993 |
| JP | H11074225 A | 3/1999 |

(Continued)

OTHER PUBLICATIONS

"PCT International Search Report and Written Opinion in PCT/US2019/037874 dated Sep. 27, 2019, 13 pages".
Machine Translation of JP2000265270 (A).

*Primary Examiner* — Jason Berman
(74) *Attorney, Agent, or Firm* — Servilla Whitney LLC

(57) ABSTRACT

A deposition system, and a method of operation thereof are disclosed. The deposition system comprises a cathode assembly comprising a rotating magnet assembly including a plurality of outer peripheral magnets surrounding an inner peripheral magnet.

13 Claims, 11 Drawing Sheets

(56) References Cited

U.S. PATENT DOCUMENTS

2014/0272684 A1* 9/2014 Hofmann ............ H01J 37/3417
430/5
2015/0136596 A1 5/2015 Nakamura et al.
2015/0279635 A1 10/2015 Subramani et al.
2016/0172168 A1 6/2016 Miller et al.

FOREIGN PATENT DOCUMENTS

| JP | 2000265270 A | 9/2000 |
| JP | 2003073828 A | 3/2003 |
| JP | 2005526916 A | 9/2005 |
| WO | 03100819 A1 | 12/2003 |

* cited by examiner

DEPOSITION SYSTEM WITH A MULTI-CATHODE

CROSS-REFERENCE TO RELATED APPLICATIONS

This application is a continuation of U.S. patent application Ser. No. 16/444,560, filed Jun. 18, 2019, which claims priority to U.S. Provisional Application No. 62/686,977, filed Jun. 19, 2018, the entire disclosure of which is hereby incorporated by reference herein.

TECHNICAL FIELD

The present disclosure relates generally to substrate processing systems, and more specifically, to deposition systems with multiple cathode assemblies (multi-cathodes).

BACKGROUND

Sputtering, alternatively called physical vapor deposition (PVD), has been used for the deposition of metals and related materials in the fabrication of semiconductor integrated circuits. Use of sputtering has been extended to depositing metal layers onto the sidewalls of high aspect-ratio holes such as vias or other vertical interconnect structures, as well as in the manufacture of extreme ultraviolet (EUV) mask blanks. In the manufacture of EUV mask blanks minimization of particle generation is desired, because particles negatively affect the properties of the final product.

Plasma sputtering may be accomplished using either DC sputtering or RF sputtering. Plasma sputtering typically includes a magnetron positioned at the back of the sputtering target including two magnets of opposing poles magnetically coupled at their back through a magnetic yoke to project a magnetic field into the processing space to increase the density of the plasma and enhance the sputtering rate from a front face of the target. Magnets used in the magnetron are typically closed loop for DC sputtering and open loop for RF sputtering.

In plasma enhanced substrate processing systems, such as physical vapor deposition (PVD) chambers, high power density PVD sputtering with high magnetic fields and high DC power can produce high energy at a sputtering target, and cause a large rise in surface temperature of the sputtering target. The sputtering target is cooled by contacting a target backing plate with cooling fluid. In plasma sputtering as typically practiced commercially, a target of the material to be sputter deposited is sealed to a vacuum chamber containing the wafer to be coated. Argon is admitted to the chamber. When a negative DC bias of several hundred volts is applied to target while the chamber walls or shields remain grounded, the argon is excited into a plasma. The positively charged argon ions are attracted to the negatively biased target at high energy and sputter target atoms from the target.

Erosion of the target causes a problem in plasma sputtering. As the target is eroded, the sputtering surface within the target layer recedes and comes closer to the magnetron so that the magnetic field at the sputtering surface changes over the lifetime of the target. The sputtering rate depends on the magnitude of the magnetic field adjacent the sputtering surface, which increases with the depth of erosion. Also, the plasma may become unstable under changes of magnetic field, possibly extinguishing or sparking, the latter of which can create damaging particulates. Regardless of the target shape, the target erodes more preferentially at specific locations with respect to the magnetic fields of the magnets of the magnetron causing an uneven or asymmetric erosion profile. The uneven erosion profile of the target may result in poor uniformity of the deposited film and uneven film characteristics across the substrate. For example, poor step coverage may be achieved at some spatial locations of the substrate while good step coverage may be achieved at other areas of the substrate. There is need to provide apparatus and methods to reduce asymmetry of erosion profiles and provide erosion profiles that are more even.

Thus, a need remains for a deposition system to be developed to resolve the uniformity problems. It would also be desirable to provide a deposition system comprising multiple cathode assemblies.

SUMMARY

According to one embodiment of the disclosure, a physical vapor deposition (PVD) chamber comprises a plurality of cathode assemblies; a shroud below the plurality of cathode assemblies; and each cathode assembly comprising a magnet assembly comprising a plurality of outer peripheral magnets surrounding an inner magnet, the outer peripheral magnets and an inner magnet mounted to a mounting plate configured to rotate during a physical vapor deposition process.

In another embodiment, a physical vapor deposition (PVD) chamber comprises a rotating cathode assembly; a shroud below the cathode assembly; the cathode assembly comprising a magnet assembly comprising a plurality of outer peripheral magnets surrounding an inner magnet, the outer peripheral magnets and an inner magnet mounted to a mounting plate configured to rotate during a physical vapor deposition process; and a balancing weight mounted to the mounting plate opposite the magnet assembly.

Another embodiment pertains to a method of depositing a material layer comprising placing a substrate in a PVD chamber; rotating a cathode assembly comprising a magnet assembly comprising a plurality of outer peripheral magnets surrounding an inner magnet, the outer peripheral magnets and an inner magnet mounted to a mounting plate; and depositing the material layer on the substrate.

Certain embodiments of the disclosure have other features or elements in addition to or in place of those mentioned above.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

Those skilled in the art will understand that the use of ordinals such as "first" and "second" to describe process regions do not imply a specific location within the processing chamber, or order of exposure within the processing chamber.

Embodiments of the disclosure pertain to a magnet design for a deposition system, for example a physical vapor deposition ("PVD") chamber comprising at least one cathode assembly, and in particular embodiments, a PVD chamber comprising multiple cathode assemblies (referred to herein as a "multi-cathode chamber).

Figure 1:
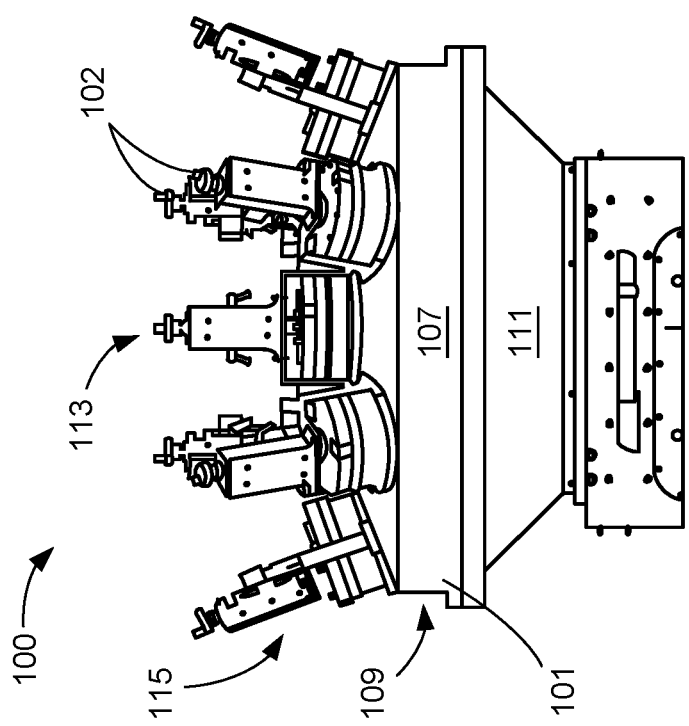
FIG. 1 is a side view of a deposition system according to an embodiment of the disclosure.

Referring now to FIG. 1, a side view of a portion of a deposition system in the form of a PVD chamber 100 is shown. The deposition system in the form of a PVD chamber in some embodiments is a multi-cathode PVD chamber 100 including a plurality of cathode assemblies 102. The multi-cathode PVD chamber 100 in some embodiments includes a multi-target PVD source configured to manufacture an MRAM (magnetoresistive random access memory) or a multi-target PVD source configured to manufacture an extreme ultraviolet (EUV) mask blank.

The multi-cathode PVD chamber comprises a chamber body 101, comprising a source adapter 107 configured to hold multiple cathode assemblies 102 in place in a spaced apart relationship. While the chamber body 101 is shown as being generally cylindrical and having the source adapter 107 having a dome portion 109 that is angled to provide a raised dome, the PVD chamber 100 of the present disclosure is not limited to the configuration shown. For example, the dome portion 109 does not have to be angled, and the dome portion in some embodiments has a profile that is generally flat. Furthermore, the chamber body can be shapes other than cylindrical, including elliptical, square or rectangular. The source adapter 107 can hold any number of the cathode assemblies 102. As a specific example, the source adapter 107 in some embodiments supports twelve cathode assemblies 102. However, in some embodiments, the source adapter 107 supports one, two, three, four, five, six, seven, eight, nine, ten, eleven, twelve, thirteen, fourteen, fifteen, sixteen, seventeen, eighteen, nineteen or twenty cathode assemblies 102.

The source adapter 107 in some embodiments is mounted onto a base adapter 111, which can be conical, cylindrical or any other shape such as square or rectangular. Both the source adapter 107 and the base adapter 111 enclose an inner volume 119 (shown in FIG. 3) which is an area where a substrate or carrier 108 is processed according to one or more embodiments.

The multi-cathode PVD chamber 100 can include multiple cathode assemblies 102 for PVD and sputtering. Each of the cathode assemblies 102 is connected to a power supply 112 (shown in FIG. 3) including direct current (DC) or radio frequency (RF). The cathode assemblies 102 can have any number of different diameters. In some embodiments, the cathode assemblies 102 all have the same diameter. In other embodiments, the cathode assemblies 102 have two, three, four, five, six or more different diameters.

Figure 2:
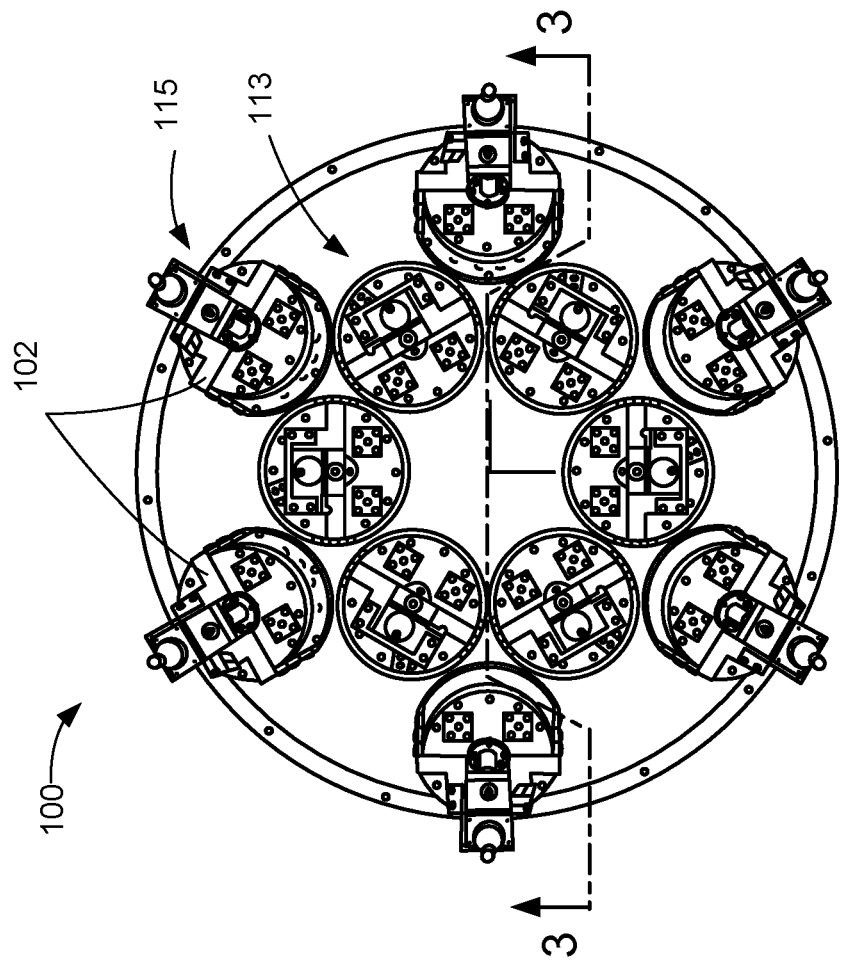
FIG. 2 is a top view of a portion of the deposition system shown in FIG. 1.

As shown in FIGS. 1 and 2, the cathode assemblies 102 in some embodiments are arranged in an inner ring 113 and an outer ring 115. These rings (inner ring 113 and outer ring 115) can also be called races. All of the cathode assemblies 102 in some embodiments are arranged in a single ring instead of the inner ring 113, and the outer ring 115 shown. In one or more embodiments, the configuration in which there is the inner ring 113 and the outer ring 115 achieves a high level of uniformity of deposition without rotating the carrier 108 shown in FIG. 3.

Figure 3:
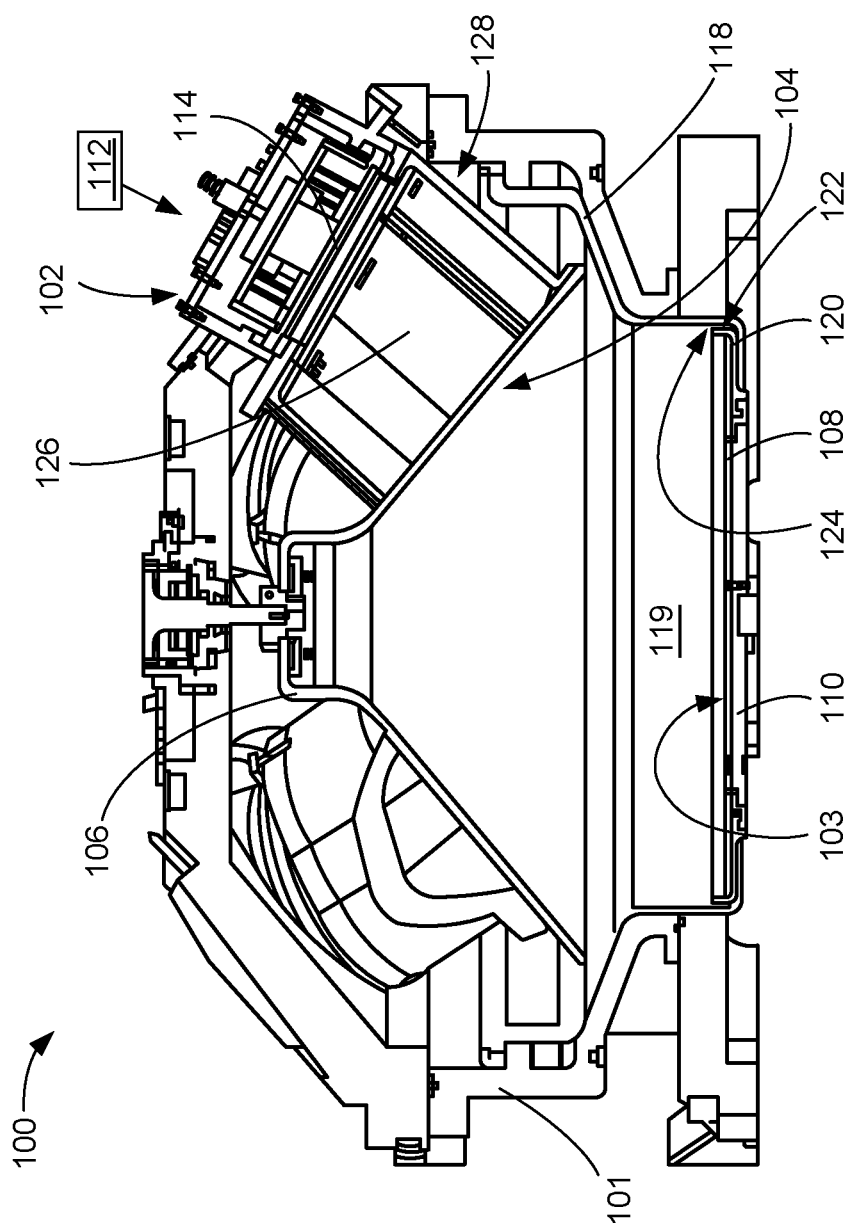
FIG. 3 is a cross-sectional view of a deposition system 100 taken along line 3-3 of FIG. 2.

Referring now to FIG. 3, a cross-sectional view of a deposition system in the form of the PVD chamber 100 is shown, taken along line 3-3 of FIG. 2 according to an embodiment of the present disclosure. The cross-sectional view depicts an example of a PVD chamber 100 including the chamber body 101 defining an inner volume 119, where a substrate or carrier is processed.

The cathode assemblies 102 in the embodiment shown in FIGS. 1-3 can be used for sputtering different materials as a material layer 103. The cathode assemblies 102 exposed through shield holes 104 of a rotating shield 106, which can be over the substrate or carrier 108 on a rotating pedestal 110. There may be only one carrier 108 over or on the rotating pedestal 110.

The substrate or carrier 108 is in one embodiment, a structure having a semiconductor material used for fabrication of integrated circuits. For example, the substrate or carrier 108 according to some embodiments comprises a semiconductor structure including a wafer. Alternatively, the carrier can be another material, such as an ultra low expansion glass substrate used to form an EUV mask blank. The substrate or carrier 108 can be any suitable shape such as round, square, rectangular or any other polygonal shape. The rotating shield 106 is formed with the shield holes 104 so that the cathode assemblies 102 can be used to deposit the material layers 103 through the shield holes 104.

A power supply 112 is applied to the cathode assemblies 102. The power supply 112 in some embodiments includes a direct current (DC) or radio frequency (RF) power supply. In some embodiments, such as the embodiment shown in FIGS. 1-3, angular positions of the cathode assemblies 102 can be changed to any angle. This design allows coaxial feed for power, such as the power supply 112, to the cathode assemblies 102.

The rotating shield 106 in some embodiments exposes one of the cathode assemblies 102 at a time and protect other cathode assemblies 102 from cross-contamination. The cross-contamination is a physical movement or transfer of a deposition material from one of the cathode assemblies 102 to another of the cathode assemblies 102. The cathode assemblies 102 are positioned over targets 114. A design of a chamber can be compact. The targets 114 can be any suitable size. For example, each of the targets 114 in some embodiments is a diameter in a range of from about 4 inches to about 20 inches, or from about 4 inches to about 15 inches, or from about 4 inches to about 10 inches, or from about 4 inches to about 8 inches or from about 4 inches to about 6 inches.

According to some embodiments, the rotating pedestal 110 allows for the use of a variety of different materials in one chamber. Features of the multi-cathode PVD chamber 100 include a single rotating shield, such as the rotating shield 106, without rotating components hidden behind the rotating shield 106. In some embodiments, the rotating shield 106 provides an advantage of improving particle performance.

In FIG. 3, the substrate or carrier 108 in some embodiments is on the rotating pedestal 110, which vertically moves up and down. Before the substrate or carrier 108 moves out of the chamber, the substrate or carrier 108 in some embodiments moves below a lower shield 118. A telescopic cover ring 120 is shown as a structure that abuts the lower shield 118. Then, the rotating pedestal 110 moves down, and then the carrier 108 is lifted up with a robotic arm before the carrier 108 moves out of the chamber.

When the material layers 103 are sputtered, the materials sputtered from the targets 114 in some embodiments are retained inside and not outside of the lower shield 118. Telescopic cover ring 120 in some embodiments includes a raised ring portion 122 that curves up and has a predefined thickness. The telescopic cover ring 120 in some embodiments also includes a predefined gap 124 and a predefined length with respect to the lower shield 118. Thus, the materials that form material layers 103 will not be below the rotating pedestal 110 thereby eliminating contaminants from spreading to the carrier 108.

FIG. 3 depicts individual shrouds 126. The shrouds 126 in some embodiments are designed such that a majority of the materials from the targets 114 that does not deposit on the carrier 108 is contained in the shrouds 126, hence making it easy to reclaim and conserve the materials. This also enables one of the shrouds 126 for each of the targets 114 to be optimized for that target to enable better adhesion and reduced defects. For example, the majority in some embodiments includes at least 80% of one of the materials.

The shrouds 126 in some embodiments are designed to minimize cross-talk or cross-target contamination between the cathode assemblies 102 and to maximize the materials captured for each of the cathode assemblies 102. Therefore, the materials from each of the cathode assemblies 102 would just be individually captured by one of the shrouds 126 over which the cathode assemblies 102 are positioned. The captured materials may not land on the substrate or carrier 108.

The substrate or carrier 108 in some embodiments is coated with uniform material layer 103 deposited on a surface of the substrate or carrier 108 using the deposition materials including a metal from the targets 114 over the shrouds 126. Then, the shrouds 126 are taken through a recovery process. The recovery process not only cleans the shrouds 126 but also recovers a residual amount of the deposition materials remained on or in the shrouds 126. The uniformity of the material layer 103 relates to how evenly or smoothly the materials are deposited at a predetermined number of locations on the surface of the substrate or carrier 108.

For example, there may be platinum on one of the shrouds 126 and then iron on another of the shrouds 126. Since platinum is a precious metal that is more valuable than iron, the shrouds 126 with platinum are sent out for the recovery process. In one or more embodiments, rotating the rotating shield 106 to expose each of the cathode assemblies 102 through the shroud 126 and one of the shield holes 104 improves reliability without the cross-contamination between the cathode assemblies 102. In some embodiments, rotating the rotating pedestal 110 improves the uniformity of the material layer 103 deposited from the targets 114.

According to one or more embodiments, by varying the power to the cathode assemblies 102, the amount of material deposited and the thickness of the material layer 103 can be varied. In some embodiments, varying the power controls the uniformity of the material layer 103. In some embodiments, better uniformity can is further be achieved by controlling the rotating pedestal 110. Each of the cathode assemblies 102 applies different materials to form material layers 103 having different compositions. For example, in some embodiments a first cathode assembly and a second cathode assembly apply alternating layers of different materials in the formation of an extreme ultraviolet mask blank, for example, alternating layers of silicon deposited from a first target and cathode assembly 102 and a molybdenum from a second target and cathode assembly 102.

Figure 4:
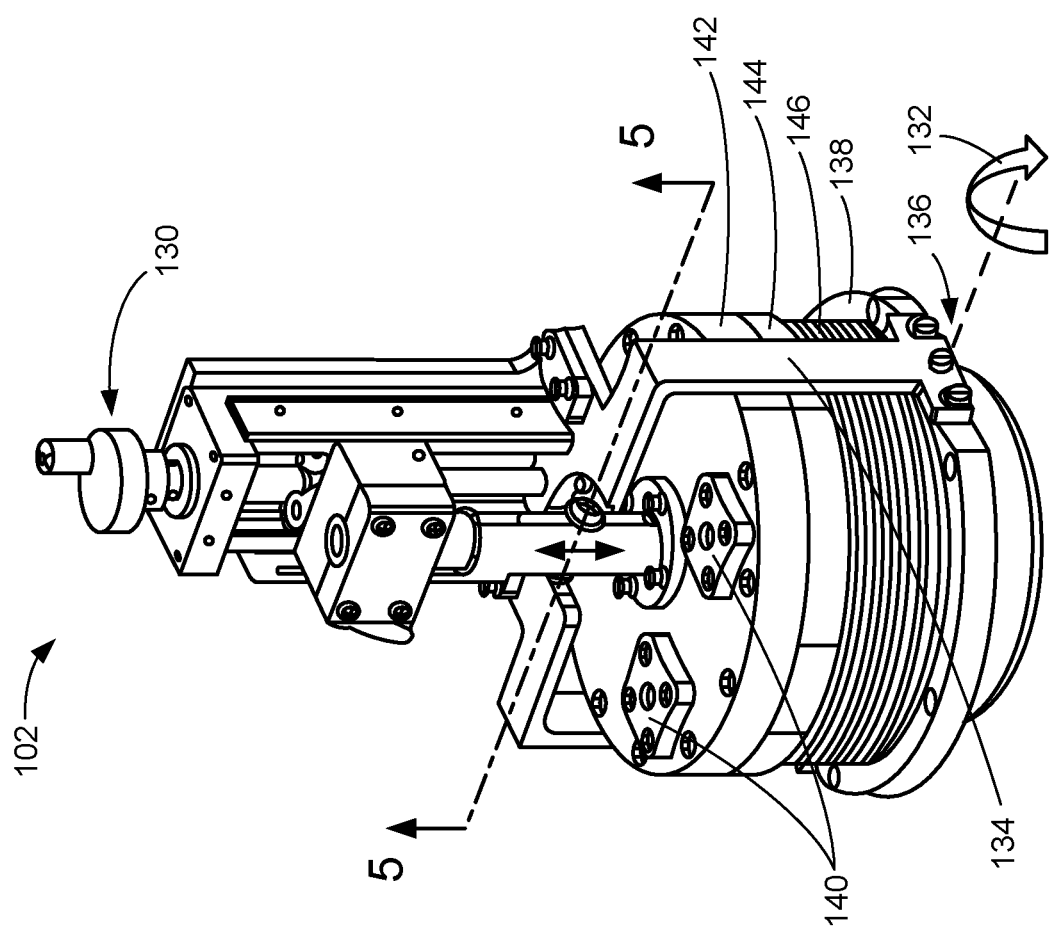
FIG. 4 is a top perspective view of one of the cathode assemblies of the deposition system of FIG. 1.

Referring now to FIG. 4, a top isometric view of one of the cathode assemblies 102 of the deposition system in the form of the multi-cathode PVD chamber 100 of FIG. 1 is shown. In some embodiments, an angular adjustment mechanism 132 provides an angular movement to change the angular positions of the cathode assemblies 102. The angular adjustment mechanism 132 in some embodiments provides the angular positions by rotating a swing arm 134 of each of the cathode assemblies 102 with respect to or based on a pivot point 136. The pivot point 136 is located at a bottom end of the swing arm 134 where the swing arm 134 is attached to a lower flange 138. In some embodiments, water adapter blocks 140 are mounted on a top plate 142. The top plate 142 in some embodiments is over an upper flange 144, which together with the lower flange 138 provides upper and lower support structures for an outer bellow assembly 146.

Figure 5:
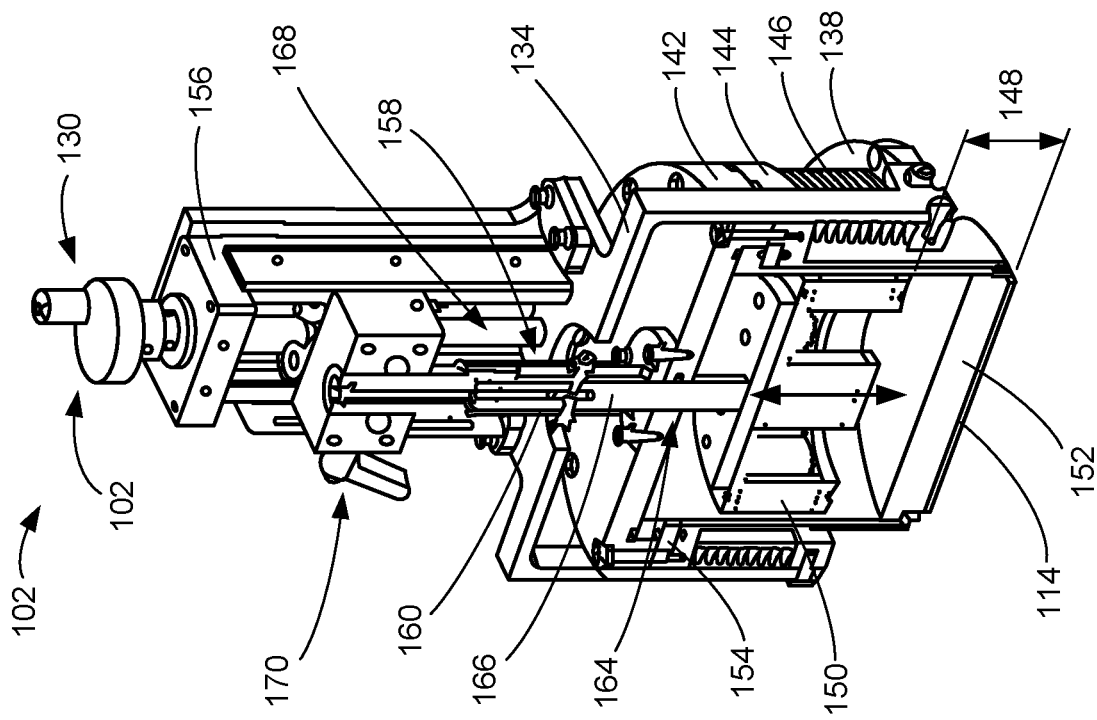
FIG. 5 is a cross-sectional view of one of the cathode assemblies taken along line 5-5 of FIG. 4.

FIG. 5 is a cross-sectional view of one of the cathode assemblies 102 taken along line 5-5 of FIG. 4. The cross-sectional view depicts an individual target source or one of the cathode assemblies 102. FIG. 5 depicts an assembly of one of the cathode assemblies 102, in which a magnet-to-target spacing 148 is adjusted during the deposition process. The magnet-to-target spacing 148 is a distance between a magnet 150 of one of the cathode assemblies 102 and one of the targets 114. The cathode assemblies 102 are adjusted manually or automatically. Each of the targets 114 is bonded or mounted to a backing plate 152, which is similar to a structure with a vessel shape, the outer bellow assembly 146 having the lower flange 138 and the upper flange 144. For example, both of the lower flange 138 and the upper flange 144 are welded with each other using flexible bellows with a conductive material including stainless steel (SST).

Each of the targets 114 are mounted inside the upper flange 144. A grounded shield is formed with the lower flange 138 and the upper flange 144 grounded. A nonconductive ring 154 helps to electrically isolate the grounded shield from the targets 114, which can be live due to connection with the power supply 112.

For example, the nonconductive ring 154 includes an insulation material, such as ceramic or clay. The grounded shield is a part that is mounted on the inside of the lower shield 118.

The top plate 142 is bolted from a top surface of the top plate 142 to compress all O-rings including the nonconductive ring 154 to hold the targets 114 in place. As such, the vacuum as well as water leak sealing is achieved. Each source or each of the cathode assemblies 102 includes a number of manual motion mechanisms described below for improving the uniformity of the material layer 103. For example, the bolted plate in some embodiments includes insulation, such as a type of an insulator material similar to fiberglass.

The manual motion mechanisms in some embodiments includes the angular adjustment mechanism 132 using the swing arm 134 that pivots around the lower flange 138. The swing arm 134 holds a linear slide 156 over the swing arm 134 and at a top portion of each of the cathode assemblies 102. The swing arm 134 adjusts the targets 114 for +/−5 degrees with respect to the carrier 108. The manual motion mechanisms include a source lift mechanism 158 with the swing arm 134 holding the linear slide 156 at the top portion of each of the cathode assemblies 102. The linear slide 156 holds a source or the materials with a hollow shaft 160. The linear slide 156 provides a source movement of the materials along the hollow shaft 160 as shown by a bidirectional vertical arrow.

The manual motion mechanisms includes a knob adjustment mechanism 162 with a manual adjustment knob or the knob 130 at the top portion of each of the cathode assemblies 102 to provide a linear actuation. The knob adjustment mechanism 162 is designed to achieve a total stroke length. The total stroke length includes any numerical value. For example, the total stroke length is 2.5 inches.

The manual motion mechanisms includes a magnet-to-target adjustment mechanism 164 to adjust the magnet-to-target spacing 148. In some embodiments, a permanent magnet is placed inside the source. An inner shaft 166 holds the magnet 150 inside the hollow shaft 160. The inner shaft 166 includes any structure for holding the magnet 150. As a specific example, the inner shaft 166 includes a Delrin® shaft.

An adjustment screw 168 on top of each of the cathode assemblies 102 provides a linear adjustment of the magnet-to-target spacing 148. A side locking screw 170 holds the magnet 150 in position after achieving a predetermined value of the magnet-to-target spacing 148. For example, a total adjustable stroke length for the magnet-to-target spacing 148 is 1 inch.

Referring now to FIGS. 6-9, an alternative embodiment of a deposition system according to an embodiment of the disclosure is shown. Similar to the embodiment shown in FIG. 1, the deposition system in the form of a PVD chamber is a multi-cathode PVD chamber 200 including a plurality of cathode assemblies 202. The multi-cathode PVD chamber 200 includes a multi-target PVD source configured to manufacture an MRAM (magnetoresistive random access memory) or a multi-target PVD source configured to manufacture an extreme ultraviolet (EUV) mask blank.

Figure 6:
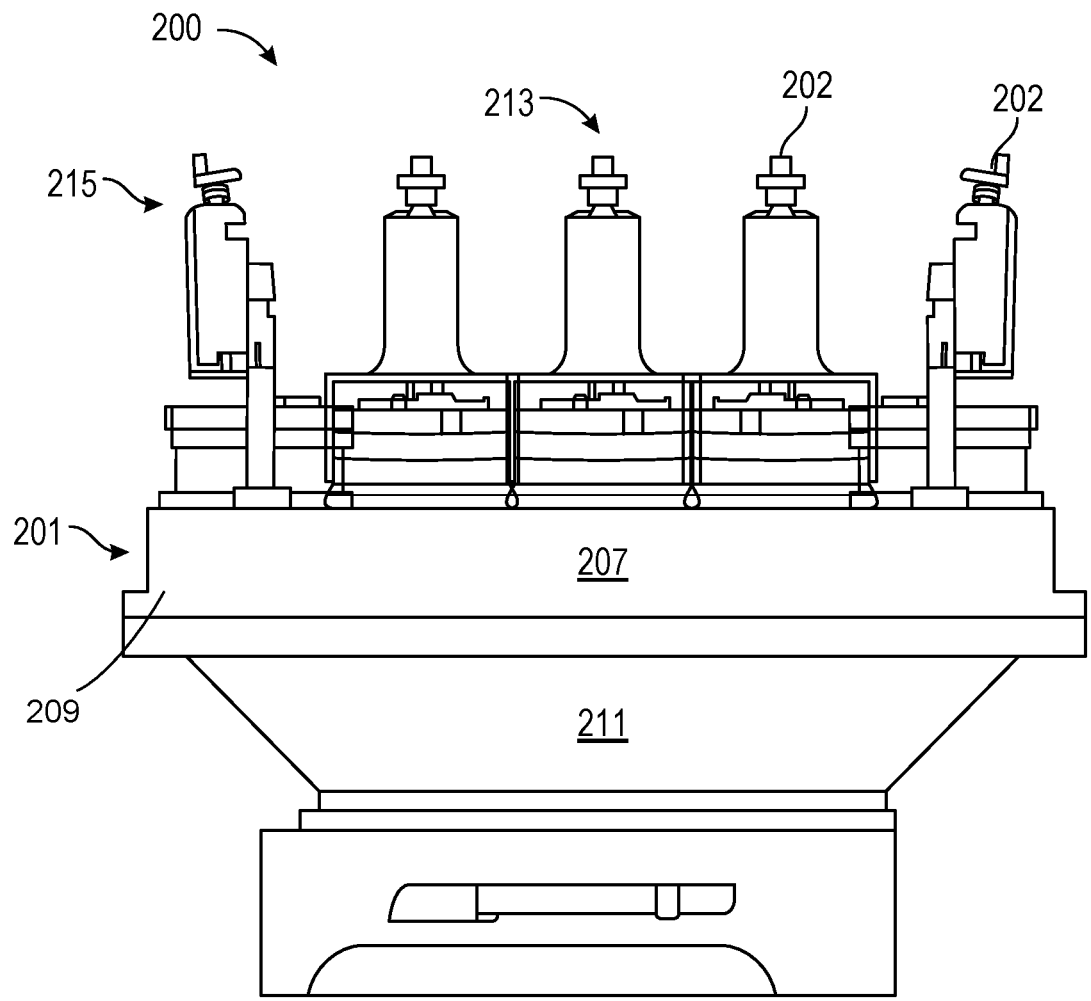
FIG. 6 is a side view of a deposition system according to an embodiment of the disclosure.
Figure 7:
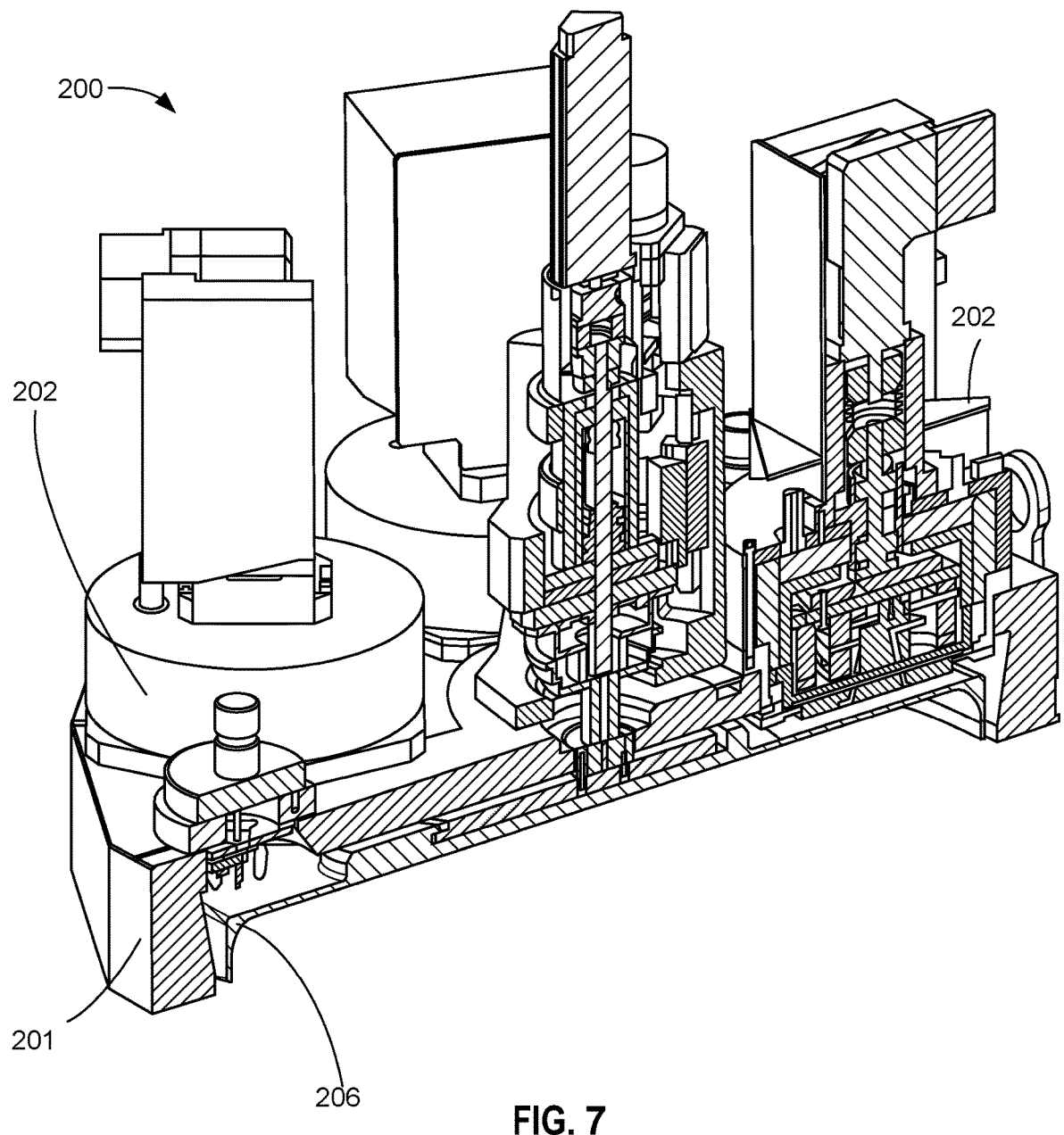
FIG. 7 is a cross-sectional view of a portion of a deposition system according to an embodiment of the disclosure.

The multi-cathode PVD chamber 200 comprises a chamber body 201, comprising a source adapter 207 configured to hold multiple cathode assemblies 102 in place in a spaced apart relationship. As can be seen in FIGS. 6 and 7, the chamber body 201 is shown as being generally cylindrical and having the source adapter 207 having a dome portion 209 flatter than the dome 109 of the multi-cathode PVD chamber 100 shown in FIG. 1. The source adapter 207 can hold any number of the cathode assemblies 202. As a specific example, the source adapter 207 supports twelve cathode assemblies 202. However, in some embodiments, the source adapter 207 supports one, two, three, four, five, six, seven, eight, nine, ten, eleven, twelve, thirteen, fourteen, fifteen, sixteen, seventeen, eighteen, nineteen, twenty, twenty-one, twenty-two, twenty-three, twenty-four or twenty-five cathode assemblies 202.

The source adapter 207 is mounted onto a base adapter 211, which can be conical, cylindrical or any other shape such as square or rectangular. Both the source adapter 207 and the base adapter 211 enclose an inner volume, which is an area where a substrate or carrier 108 is processed according to one or more embodiments.

The multi-cathode PVD chamber 200 includes multiple cathode assemblies 202 for PVD and sputtering. Each of the cathode assemblies 202 are connected to a power supply (not shown) including direct current (DC) or radio frequency (RF). The cathode assemblies 202 have any number of different diameters. In some embodiments, the cathode assemblies 202 all have the same diameter. In other embodiments, the cathode assemblies 202 have two, three, four, five, six or more different diameters. Similar to the embodiment shown in FIGS. 1 and 2, the cathode assemblies 202 are arranged in an inner ring 213 and an outer ring 215. All of the cathode assemblies 202 are arranged in a single ring instead of inner and outer rings.

Figure 8:
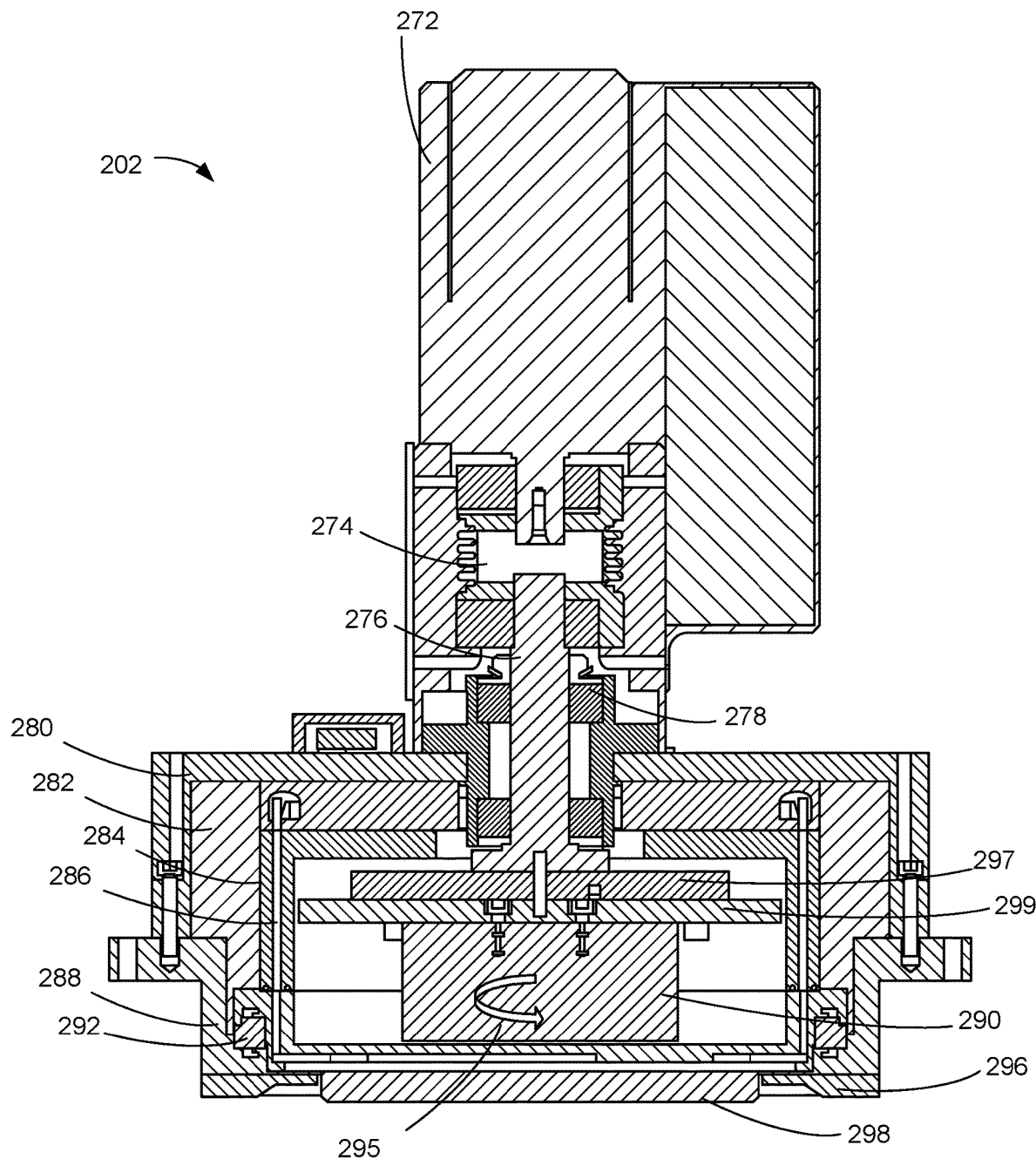
FIG. 8 is cross-sectional view of one of the cathode assemblies shown in FIG. 7.

FIG. 7 is a cross-sectional view of a portion of a multi-cathode PVD chamber according to an embodiment of the disclosure showing cathode assemblies 202, chamber body 201 and shield 206. FIG. 8 is cross-sectional view of one of the cathode assemblies 202 shown in FIG. 7. The cathode assembly 202 shown in FIG. 8 according to one or more embodiments comprises a motor 272, which drives a motor shaft 276 that rotates a magnet assembly 290 in the direction shown by arrow 295. A coupler 274 couples the motor 272 to the motor shaft 276. Bearings 278 surround the motor shaft to facilitate rotational motion in the direction of arrow 295. The cathode assembly 202 further comprises an upper housing 280 and a lower housing 288 surrounding an insulator 282, which surrounds a conductor 284 including a coolant channel 286 therethrough to cool the cathode assembly 202 during processing. The upper housing 280 and the lower housing 288 may be assembled together using any suitable fasteners or fastening system such as machine screws or bolts. The cathode further comprises an insulator ring 292 and an O-ring 294 at a base of the conductor 284. Deposition barrier 296 is provided at the bottom of the cathode assembly 202. Assembled to the motor shaft 276 are an insulator plate 297 and a mounting plate 299 for securing the magnet assembly to the motor shaft 276. A target 298 comprising material to be sputtered (e.g., silicon or molybdenum, etc.) is at the bottom of the cathode assembly 202.

Figure 9:
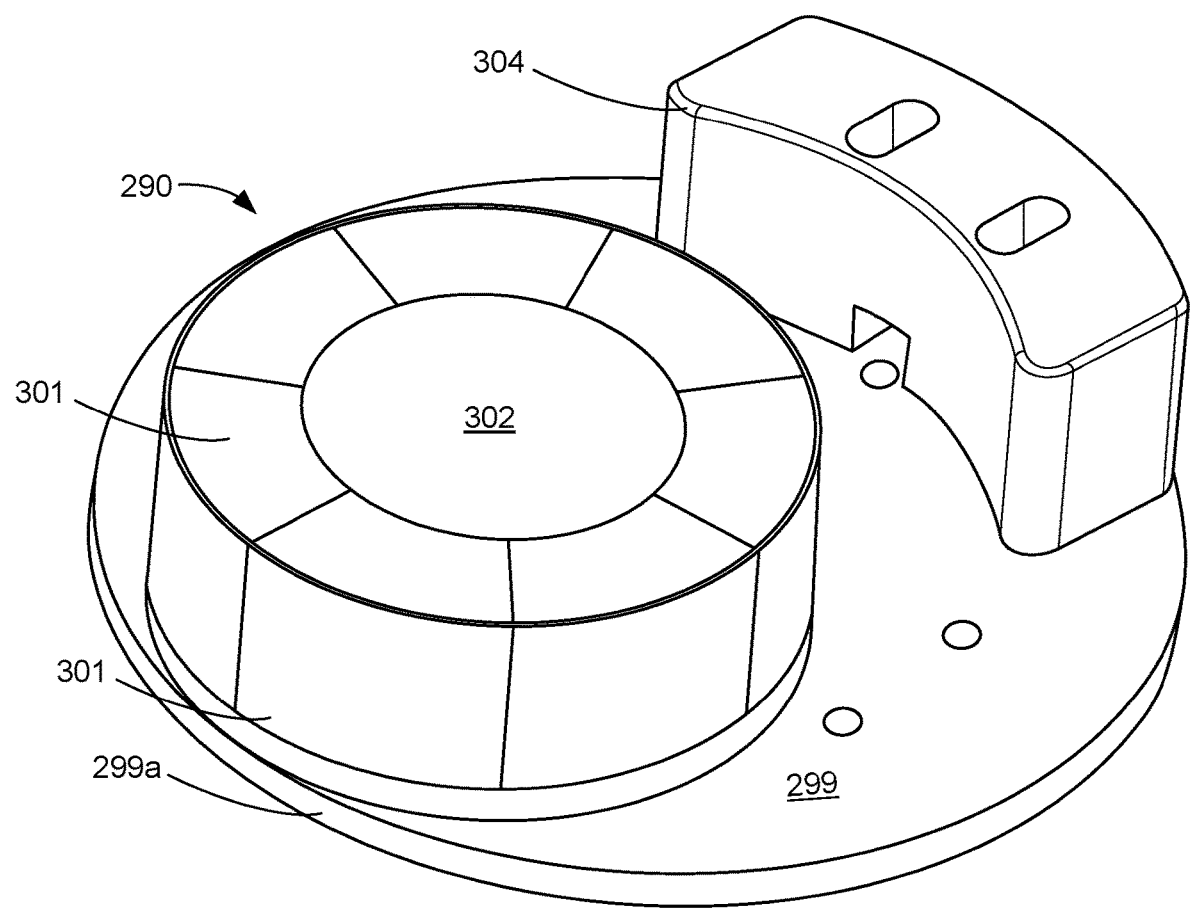
FIG. 9 is a top perspective view of a magnet system according to one or more embodiments.
Figure 10:
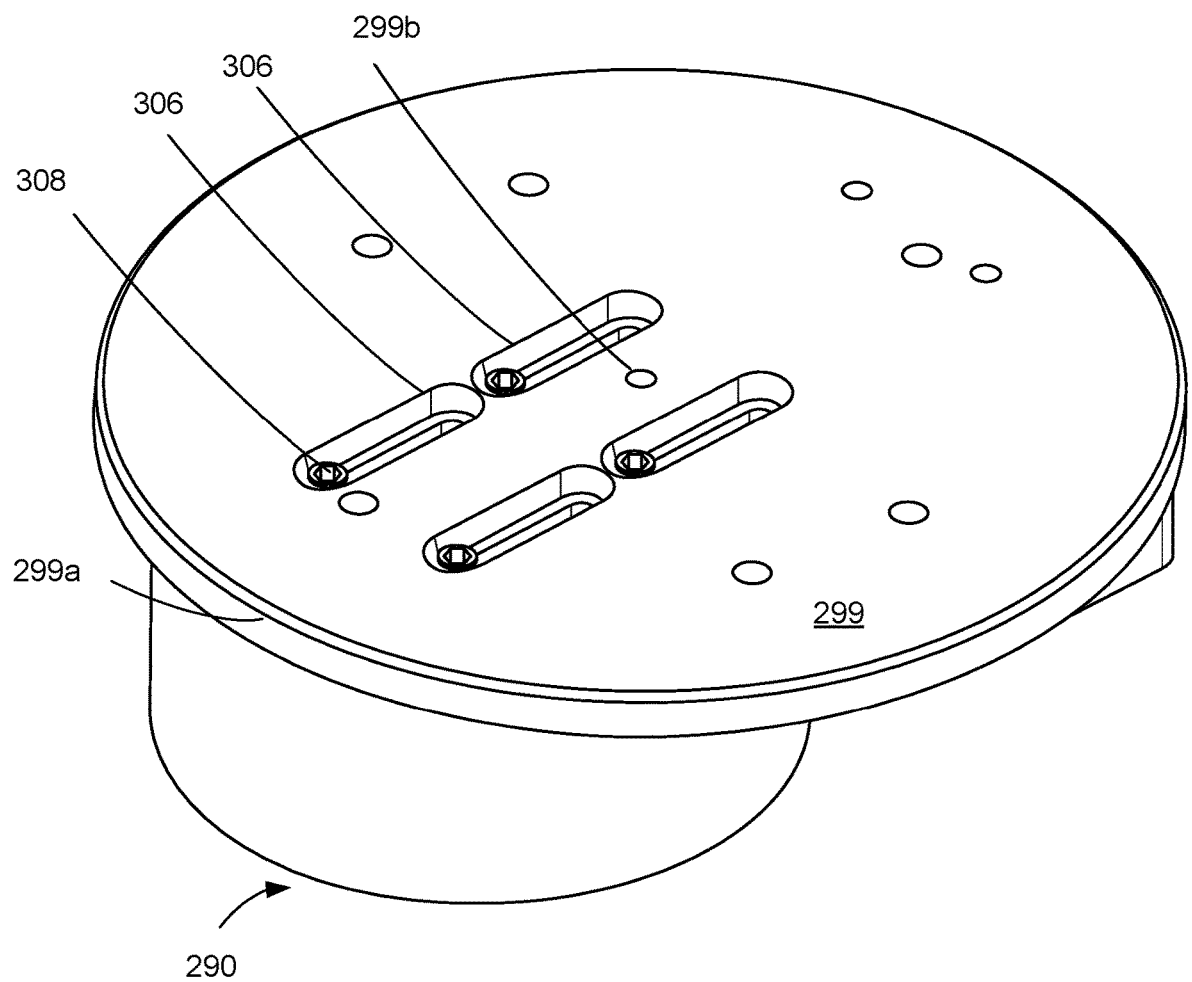
FIG. 10 is a bottom perspective view of a magnet system according to one or more embodiments.

FIGS. 9 and 10 show details of the magnet assembly according to one or more embodiments. The magnet assembly 290 comprises a plurality of outer peripheral magnets 301 of a first polarity (e.g., North) surrounding an inner magnet 302 of a second polarity (e.g., South) opposite the first polarity. In one or more embodiments, the mounting plate 299 has mounting slots 306, which permit the magnet assembly 290 to be slidably mounted at a plurality of positions with respect to a peripheral edge 299a of the mounting plate 299. In the position shown in FIG. 10, the outer peripheral magnets 301 of the magnet assembly 290 are positioned so that the outer peripheral magnets 301 abut the peripheral edge 299a of the mounting plate 299. By releasing magnet assembly fasteners 308 (e.g., bolts or machine screws), the mounting magnet assembly 290 is slidably moved so that the magnet assembly 290 is further away from the peripheral edge 299a and closer to the center 299b of the mounting plate 299. A balancing weight 304 is mounted opposite the magnet assembly 290 to balance rotation of the mounting plate 299 and magnets 301, 302 when the magnet assembly 290 is rotated in use. In the embodiment shown, there are seven outer peripheral magnets 301 that surround the inner magnet 302. In one or more embodiments, there are three, four, five, six, seven, eight, nine, ten, eleven, twelve or more outer peripheral magnets 301 surrounding the central magnet 302. In the embodiment shown, each of the peripheral magnets 301 contact the inner magnet 302, and adjacent outer peripheral magnets 301 are in contact with each other.

Figure 11:
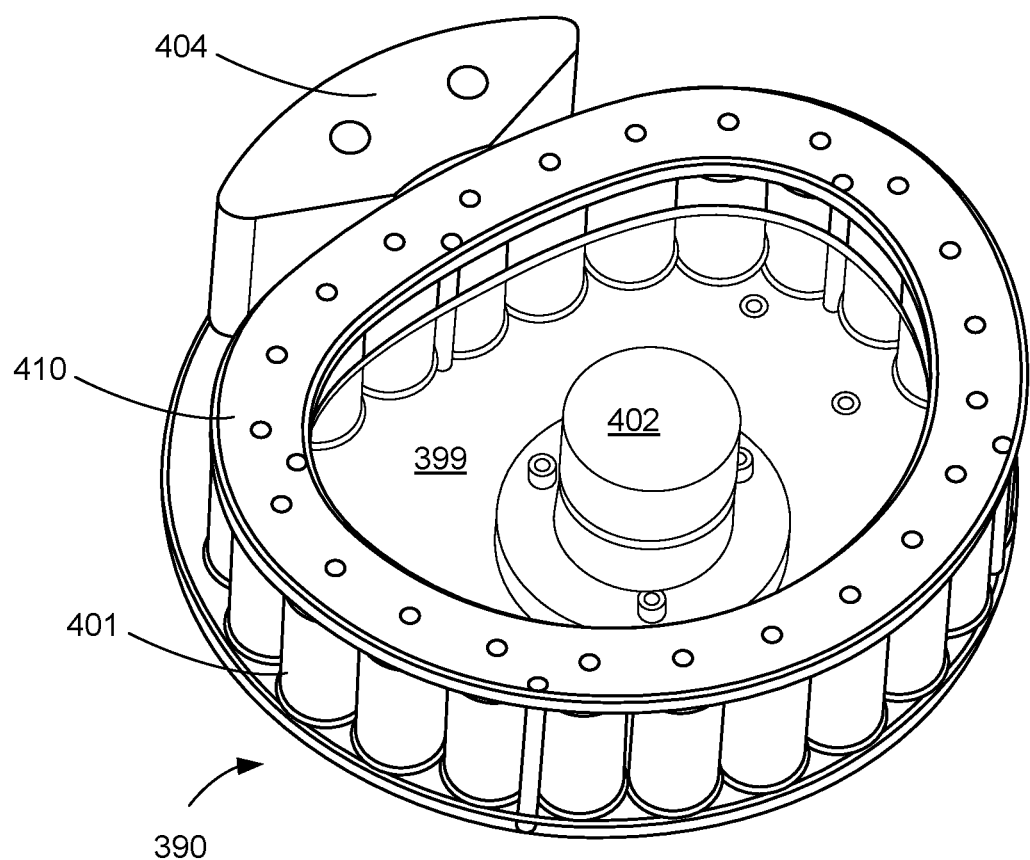
FIG. 11 is a top perspective view of a magnet system according to one or more embodiments.

FIG. 11 is a top perspective view of a magnet system according another embodiment of a magnet assembly 390. In FIG. 11, a mounting plate holds an inner magnet 402 surrounded by a plurality of outer peripheral magnets 401. The plurality of outer peripheral magnets 401 are of a first polarity (e.g., North) surrounding an inner magnet 402 of a second polarity (e.g., South) opposite the first polarity. A balancing weight 404 is mounted to the mounting plate 399 opposite the magnet assembly 390 to balance rotation of the mounting plate 399 and the magnets 401, 402 when the magnet assembly 390 is rotated in use. A peripheral ring 410 is secured to the outer peripheral magnets 401. The outer peripheral magnets 401 in the embodiment shown are generally cylindrical and surround the inner magnet 402 with a gap between the outer peripheral magnets 401 and the inner magnet 402. There are generally at least eight, nine, ten, eleven, twelve, thirteen, fourteen, fifteen, sixteen, seventeen, eighteen, nineteen, twenty, twenty-one, twenty-two, twenty-three, twenty-four, twenty-five, twenty-six, twenty-seven, twenty-eight, twenty-nine or thirty outer peripheral magnets 401 forming a ring or race around the inner magnet 402.

Figure 12:
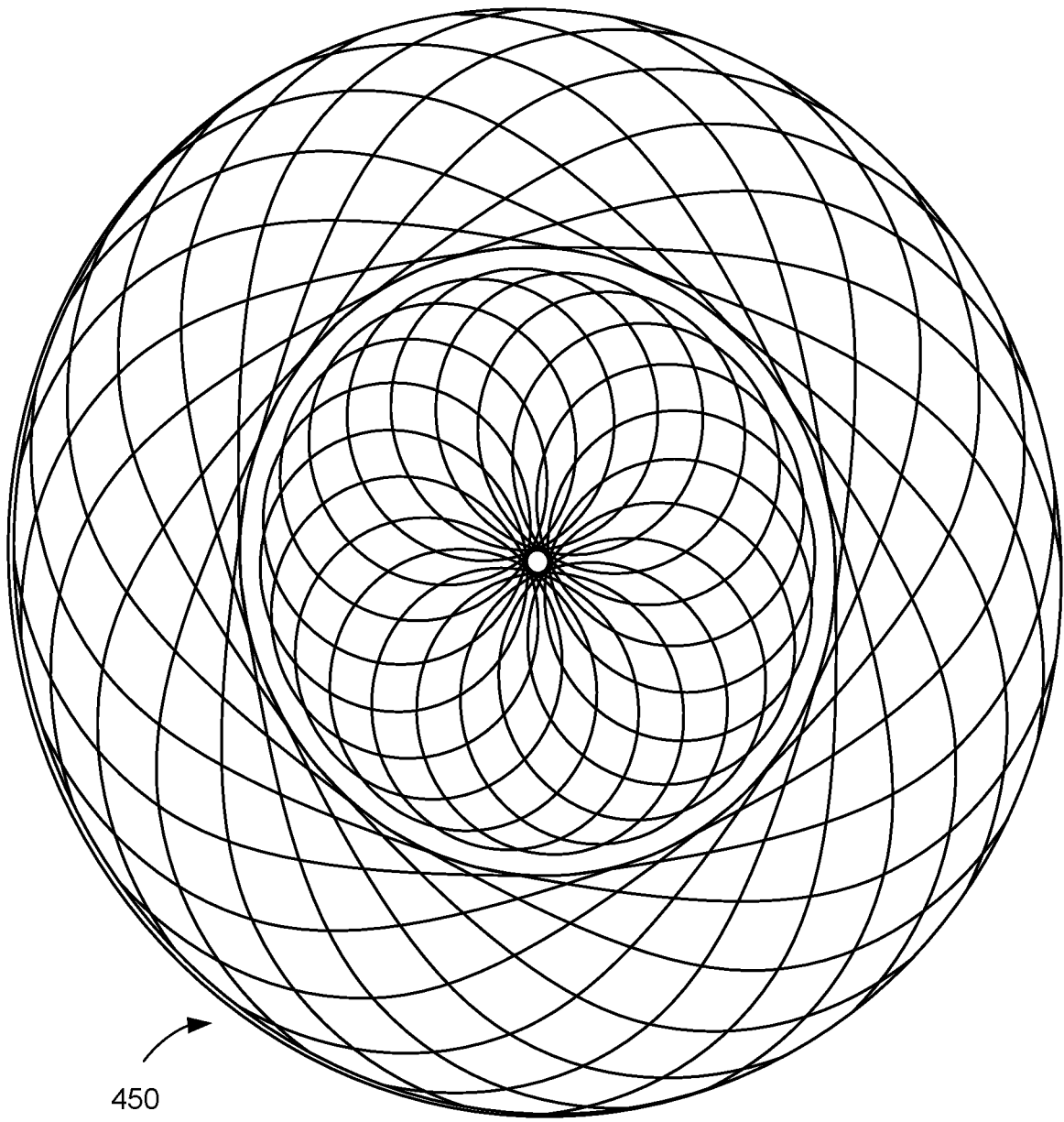
FIG. 12 is a depiction of erosion of a face of a target according to one or more embodiments.
Figure 13A:
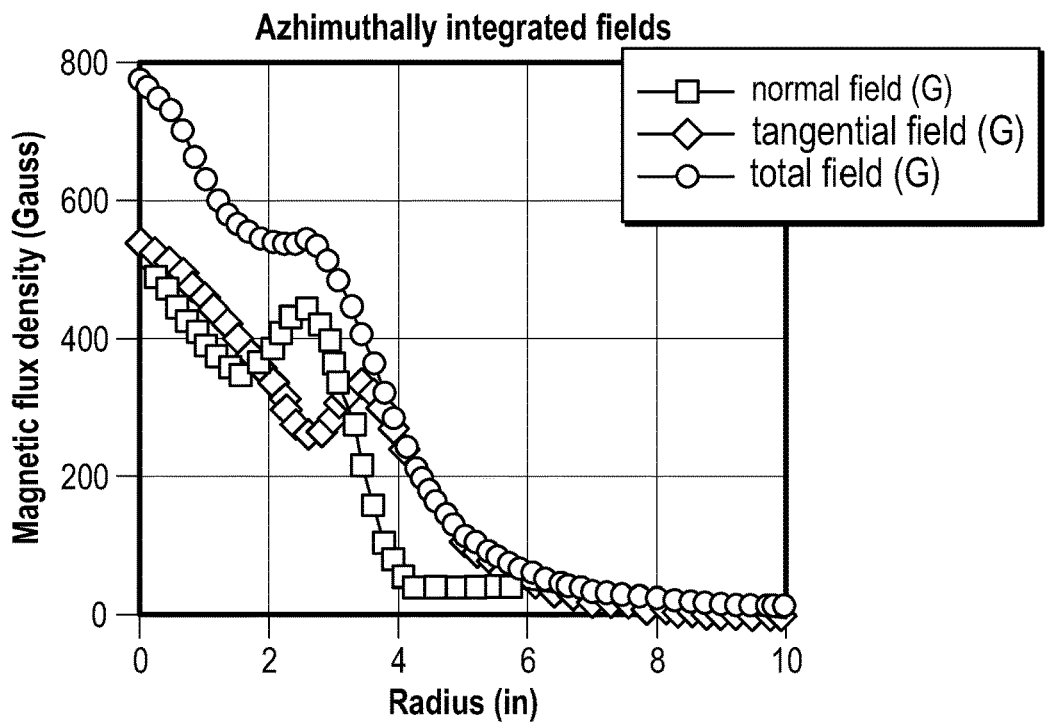
FIG. 13A is a graph of magnetic flux versus radius using modeling data from a PVD chamber comprising a rotating magnet assembly comprising a plurality of outer peripheral magnets surrounding an inner peripheral magnet according to one or more embodiments.
Figure 13B:
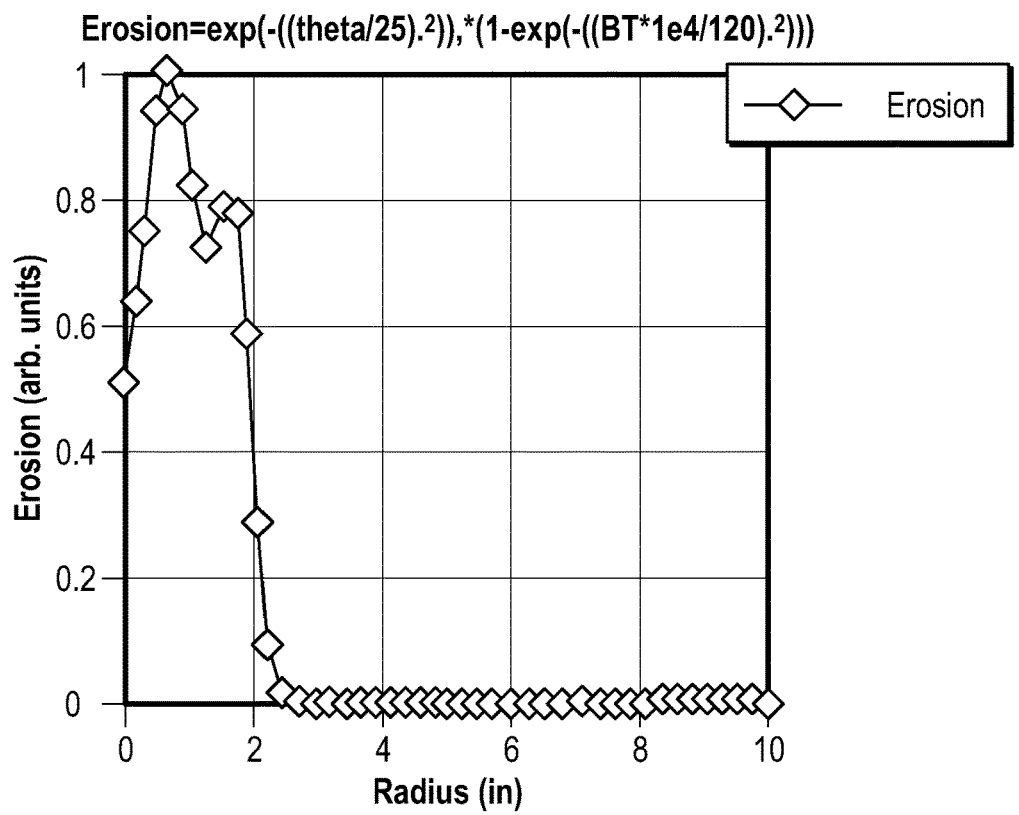
FIG. 13B is a graph of erosion of a target versus radius using modeling data from a PVD chamber comprising a rotating magnet assembly comprising a plurality of outer peripheral magnets surrounding an inner peripheral magnet according to one or more embodiments.

FIG. 12 depicts full face erosion of a face of a target 450 according to one or more embodiments. Generally, existing cathode assemblies in multi-cathode systems have static magnets, which are submerged in water, and this arrangement tends to lead to erosion tracks, re-deposition on unsputtered areas, higher defects and low target utilization. The configurations of the present disclosure resulted from a redesign to accommodate rotating magnet assembly (shaft, motor, magnet holder, magnet), to provide uniform full face erosion from the target. FIG. 13A is a graph of magnetic flux versus radius obtained using modeling data from a PVD chamber comprising a rotating magnet assembly comprising a plurality of outer peripheral magnets surrounding an inner peripheral magnet according to one or more embodiments. FIG. 13B is a graph of erosion of a target versus radius using modeling data from a PVD chamber comprising a rotating magnet assembly comprising a plurality of outer peripheral magnets surrounding an inner peripheral magnet according to one or more embodiments.

One or more embodiments described herein are particularly useful in multi-cathode PVD systems with rotating magnets. Prior art designs with larger cooling cavities limited the ability to utilize rotating magnets. In addition, preliminary modelling data shows that with a rotating magnet design in a multi-cathode PVD reactor, a more uniform erosion profile of the source material compared to existing designs.

The target assemblies described herein may be particularly useful in the manufacture of extreme ultraviolet (EUV) mask blanks. An EUV mask blank is an optically flat structure used for forming a reflective mask having a mask pattern. In one or more embodiments, the reflective surface of the EUV mask blank forms a flat focal plane for reflecting the incident light, such as the extreme ultraviolet light. An EUV mask blank comprises a substrate providing structural support to an extreme ultraviolet reflective element such as an EUV reticle. In one or more embodiments, the substrate is made from a material having a low coefficient of thermal expansion (CTE) to provide stability during temperature changes. The substrate according to one or more embodiments is formed from a material such as silicon, glass, oxides, ceramics, glass ceramics, or a combination thereof.

An EUV mask blank includes a multilayer stack, which is a structure that is reflective to extreme ultraviolet light. The multilayer stack includes alternating reflective layers of a first reflective layer and a second reflective layer. The first reflective layer and the second reflective layer form a reflective pair. In a non-limiting embodiment, the multilayer stack includes a range of 20-60 of the reflective pairs for a total of up to 120 reflective layers.

The first reflective layer and the second reflective layer are formed from a variety of materials. In an embodiment, the first reflective layer and the second reflective layer are formed from silicon and molybdenum, respectively. The multilayer stack forms a reflective structure by having alternating thin layers of materials with different optical properties to create a Bragg reflector or mirror. The alternating layers, for example, molybdenum and silicon, are formed by physical vapor deposition, for example, in a multi-cathode PVD chamber.

A first embodiment of the disclosure pertains to a physical vapor deposition (PVD) chamber comprising a plurality of cathode assemblies and a shroud below the plurality of cathode assemblies. In embodiments, each cathode assembly comprises a magnet assembly comprising a plurality of outer peripheral magnets surrounding an inner magnet, the outer peripheral magnets and an inner magnet mounted to a mounting plate configured to rotate during a physical vapor deposition process.

In a second embodiment, the PVD chamber of the first embodiment further comprises a rotating shield below the plurality of cathode assemblies to expose one of the plurality cathode assemblies through the shroud and through a shield hole of the rotating shield, a target below each of the plurality of cathode assemblies, and a rotating pedestal for producing a material to form a carrier over the rotating pedestal. In a third embodiment, the PVD chamber of the first or second embodiment further includes the feature that the plurality of outer peripheral magnets comprises at least three outer peripheral magnets surrounding the inner magnet. In a fourth embodiment, the first through third embodiments include the feature that the plurality of outer peripheral magnets comprises at least seven outer peripheral magnets surrounding the inner magnet. In a fifth embodiment, the first through fourth embodiment includes the feature that the outer peripheral magnets are in contact with the inner magnet. In a sixth embodiment, the first embodiment includes the feature that the plurality of outer peripheral magnets comprises twenty-three magnets.

In a seventh embodiment, the first through sixth embodiments include the feature that the plurality of outer peripheral magnets are of a first polarity and the inner magnet is of a second polarity opposite the first polarity. In an eighth embodiment, the first through seventh embodiments further comprise a balancing weight mounted to the mounting plate opposite the magnet assembly. In a ninth embodiment, the first through eighth embodiments further comprises the mounting plate including mounting slots, and the magnet assembly is slidably mounted to mounting plate to allow the magnet assembly to be moved toward and away from a peripheral edge of the mounting plate. In a tenth embodiment, the first embodiment includes the feature that the plurality of outer peripheral magnets comprises at least twenty magnets. In an eleventh embodiment, the first through tenth embodiments includes the feature that the plurality of cathode assemblies comprises at least twelve cathode assemblies.

A twelfth embodiment pertains to a physical vapor deposition (PVD) chamber comprising a rotating cathode assembly, a shroud below the cathode assembly, the cathode assembly comprising a magnet assembly comprising a plurality of outer peripheral magnets surrounding an inner magnet, the outer peripheral magnets and an inner magnet mounted to a mounting plate configured to rotate during a physical vapor deposition process, and a balancing weight mounted to the mounting plate opposite the magnet assembly.

In a thirteenth embodiment, the twelfth embodiment further comprises a plurality of cathode assemblies. In a fourteenth embodiment, the twelfth and thirteenth embodiments include the feature that the magnet assembly comprises seven outer peripheral magnets in contact with the inner magnet. In a fifteenth embodiment, the twelfth and thirteenth embodiments include the feature that the magnet assembly comprises at least twenty peripheral magnets.

A sixteenth embodiment pertains to a method of depositing a material layer comprising placing a substrate in a PVD chamber; rotating a cathode assembly comprising a magnet assembly comprising a plurality of outer peripheral magnets surrounding an inner magnet, the outer peripheral magnets and an inner magnet mounted to a mounting plate; and depositing the material layer on the substrate. In a seventeenth embodiment, the sixteenth embodiment includes the feature that the mounting plate comprises a balancing weight mounted on a mounting plate opposite the magnet assembly. In an eighteenth embodiment, the sixteenth and seventeenth embodiments include the feature that the PVD chamber comprises a plurality of cathode assemblies. In a nineteenth embodiment, the sixteenth through eighteenth embodiments include the feature that the substrate comprises an extreme ultraviolet mask blank. In a twentieth embodiment, the sixteenth through nineteenth embodiments further comprise depositing multiple alternating material layers comprising a first layer comprising molybdenum and a second layer comprising silicon.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A physical vapor deposition (PVD) chamber comprising:
   a plurality of cathode assemblies;
   each of the plurality of cathode assemblies comprising a motor which rotationally drives a motor shaft which rotates a magnet assembly coupled to the motor shaft, the magnet assembly comprising a plurality of outer peripheral magnets having a first polarity secured to a ring and forming a race spaced apart from and surrounding a single inner magnet having a second polarity opposite the first polarity, the magnet assembly mounted to a mounting plate and configured to rotate during a physical vapor deposition process; and
   a balancing weight mounted to the mounting plate opposite the magnet assembly, wherein each of the plurality of cathode assemblies further comprises a housing surrounding a conductor which surrounds the magnet assembly and the mounting plate, the conductor including a coolant channel to cool each of the plurality of cathode assemblies.

2. The PVD chamber of claim 1, the balancing weight mounted to an outer peripheral edge of the mounting plate, and the race mounted to the outer peripheral edge of the mounting plate.

3. The PVD chamber of claim 2, wherein the plurality of outer peripheral magnets comprises from eight to thirty peripheral magnets.

4. The PVD chamber of claim 2, wherein the plurality of outer peripheral magnets comprises from fifteen to thirty peripheral magnets.

5. The PVD chamber of claim 1, wherein the plurality of outer peripheral magnets comprises at least twenty magnets.

6. The PVD chamber of claim 1, wherein the plurality of outer peripheral magnets comprises twenty-three magnets.

7. The PVD chamber of claim 2, further comprising:
   a rotating shield below the plurality of cathode assemblies to expose one of the plurality cathode assemblies through a shroud and through a shield hole of the rotating shield;
   a target below each of the plurality of cathode assemblies; and
   a rotating pedestal for producing a material to form a carrier over the rotating pedestal.

8. The PVD chamber of claim 1, wherein the plurality of cathode assemblies comprises at least six cathode assemblies.

9. The PVD chamber of claim 1, wherein the plurality of cathode assemblies comprises at least twelve cathode assemblies.

10. A method of depositing a material layer comprising:
    placing a substrate in the PVD chamber according to claim 1;

rotating the mounting plate and the magnet assembly; and depositing the material layer on the substrate.

11. The method of claim 10, the magnet assembly is configured to provide uniform full face erosion from a target which is part of each of the plurality of cathode assemblies.

12. The method of claim 10, wherein the substrate comprises an extreme ultraviolet mask blank.

13. The method of claim 12, further comprising depositing multiple alternating materials layers comprising a first layer comprising molybdenum and a second layer comprising silicon.

* * * * *